United States Patent
Goeke

(10) Patent No.: US 7,545,155 B2
(45) Date of Patent: Jun. 9, 2009

(54) PARALLEL AC MEASUREMENT METHOD

(75) Inventor: Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 73 days.

(21) Appl. No.: 11/788,499

(22) Filed: Apr. 20, 2007

(65) Prior Publication Data

US 2008/0258741 A1    Oct. 23, 2008

(51) Int. Cl.
*G01R 27/26* (2006.01)
(52) U.S. Cl. .......... 324/688; 324/523; 324/76.83; 702/69; 702/112
(58) Field of Classification Search .......... 324/686
See application file for complete search history.

(56) References Cited

U.S. PATENT DOCUMENTS

| | | | | |
|---|---|---|---|---|
| 4,353,031 A | * | 10/1982 | Bock | 327/164 |
| 6,366,099 B1 | * | 4/2002 | Reddi | 324/678 |
| 6,504,885 B1 | * | 1/2003 | Chen | 375/350 |
| 6,611,595 B1 | * | 8/2003 | Leckschat et al. | 379/417 |
| 6,658,362 B1 | * | 12/2003 | Holden et al. | 702/108 |
| 2007/0089010 A1 | * | 4/2007 | Kirmser et al. | 714/738 |
| 2008/0172588 A1 | * | 7/2008 | Olgaard | 714/742 |
| 2008/0188185 A1 | * | 8/2008 | Shi | 455/67.13 |

FOREIGN PATENT DOCUMENTS

WO    WO 9839855 A2 *  9/1998

OTHER PUBLICATIONS

Efficient Microwave Bias and Testing Using the HP 4142B Modular DC Source/Monitor. Hewlett Packard. Application Note 1205 (Date: At least as early as Aug. 30, 2006.).

* cited by examiner

*Primary Examiner*—Timothy J Dole
*Assistant Examiner*—Benjamin M Baldridge
(74) *Attorney, Agent, or Firm*—Pearne & Gordon LLP

(57) ABSTRACT

A method for making electrical measurements of a first and a second DUT, the DUTs being in sufficient proximity to exhibit crosstalk therebetween, the method comprising: applying a first signal to the first DUT; applying a second signal to the second DUT, the first signal and the second signal being contemporaneous and orthogonal to each other; measuring a first DUT response; and measuring a second DUT response. The first and second DUT responses exhibit independence from the second and first signals, respectively.

6 Claims, 1 Drawing Sheet

PARALLEL AC MEASUREMENT METHOD

BACKGROUND OF THE INVENTION

The present invention is related to making electrical measurements and, in particular, to making AC measurements on closely spaced devices.

AC measurements on devices such as semiconductor devices are important for reasons that include insuring that devices meet specifications and perform as expected and for the monitoring of the overall performance of the fabrication and/or assembly process.

Closely spaced devices are often tested separately from their neighbors to avoid crosstalk (e.g., inductive coupling, capacitive coupling, and RF coupling) that limits the available accuracy of the AC measurements. A device under test (DUT) may have an AC signal applied and the response thereto measured. If this DUT is in close proximity of another DUT that also has an AC signal applied, the resulting measurement may be degraded by crosstalk from other AC signal. The degree of proximity at which the crosstalk occurs can be a function of many parameters (e.g., frequency, power and physical structure, to name a few).

Testing DUTs separately results in the loss of the efficiency that can be achieved with parallel (i.e., contemporaneous testing). DUTs can be tested much faster in parallel. Separate testing results in higher costs, as well as increased test time.

SUMMARY OF THE INVENTION

A method for making electrical measurements of a first and a second DUT, the DUTs being in sufficient proximity to exhibit crosstalk therebetween, the method comprising: applying a first signal to the first DUT; applying a second signal to the second DUT, the first signal and the second signal being contemporaneous and orthogonal to each other; measuring a first DUT response; and measuring a second DUT response. The first and second DUT responses exhibit independence from the second and first signals, respectively.

DESCRIPTION OF THE PREFERRED EMBODIMENTS

Figure 1:
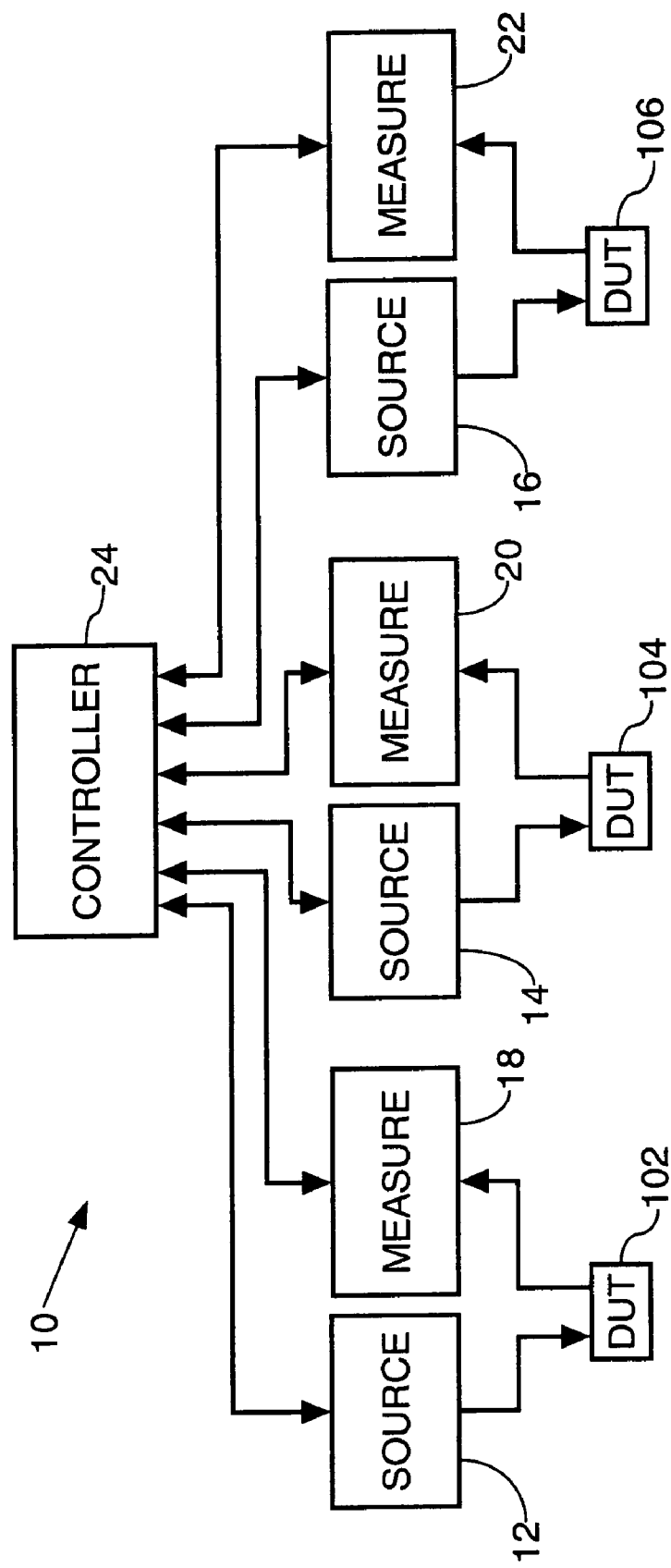
FIG. 1 is a block diagram of an electrical measurement system that can be used to perform measurements according to the invention.

Referring to FIG. 1, an electrical measurement system 10 includes three signal sources 12, 14, 16 and three measurement instruments 18, 20, 22. The sources 12, 14, 16 and the instruments 18, 20, 22 are controlled by a controller 24. The sources may be, for example, sinusoidal signal sources or sources other AC signals, including for example: square waves, triangle waves, pulse trains and so on. The instruments may be, for example, AC voltmeters, AC ammeters, AC power meters, frequency meters, capacitance meters and inductance meters, including devices that digitize such measurements. While shown separately, the sources and instruments (and controller) may be combined into one or more combination apparatuses.

For testing, a signal source and a measurement instrument are attached to respective DUTs. For example, source 12 and instrument 18 are attached to DUT 102, source 14 and instrument 20 are attached to DUT 104 and source 16 and instrument 22 are attached to DUT 106.

For ease of understanding, consider the case of only two sources, two instruments and two DUTs, where the sources provide orthogonal sinusoidal signals. Orthogonal signals have the property that the cross-products between the signals are zero in some space of interest.

For example, to measure two DUTs using frequency $f_A$, and each DUT's response is observed for a time window $t_w$, where $t_w$ is a large integer multiple, M, of the period of $f_A$. Stimulate the first DUT with $f_A$ and then stimulate the second DUT with $$f_B = f_A + \frac{1}{t_w}$$

then the two stimuli are orthogonal. For a digitally sampled system let the sample frequency equal N times $$\frac{1}{t_w}.$$

Then $$f_A = \frac{M}{t_w}, f_s = \frac{N}{t_w}, f_B = \frac{M+1}{t_w}$$

and the discrete Fourier transforms (DFTs) (frequency space) are $$DUT\ A\ \text{Real} \Rightarrow R_A = \frac{1}{N}\sum_{n=0}^{N-1} A_n * \cos\left(2\pi \cdot \frac{M}{N} \cdot n\right)$$

$$DUT\ A\ \text{Imaginary} \Rightarrow I_A = \frac{1}{N}\sum_{n=0}^{N-1} A_n * \sin\left(2\pi \cdot \frac{M}{N} \cdot n\right)$$

$$DUT\ B\ \text{Real} \Rightarrow R_B = \frac{1}{N}\sum_{n=0}^{N-1} B_n * \cos\left(2\pi \cdot \frac{M+1}{N} \cdot n\right)$$

$$DUT\ B\ \text{Imaginary} \Rightarrow I_B = \frac{1}{N}\sum_{n=0}^{N-1} B_n * \sin\left(2\pi \cdot \frac{M+1}{N} \cdot n\right)$$

Where $A_n$ and $B_n$ are the sampled responses of the DUTs both containing the response of the DUT and cross talk from the other DUT.

$$A_n = a\cos\left(2\pi \cdot \frac{M}{N} \cdot n + \phi_A\right) + b_x \cos\left(2\pi \cdot \frac{M+1}{N} \cdot n + \phi_{Bx}\right)$$

$$B_n = b\cos\left(2\pi \cdot \frac{M+1}{N} \cdot n + \phi_B\right) + a_x \cos\left(2\pi \cdot \frac{M}{N} \cdot n + \phi_{Ax}\right)$$

When these signals are applied to the DFT equations for DUT A and DUT B the cross talk terms, $b_x$ and $a_x$, sum to zero and are rejected.

The two DUT are not measured using the exact same frequency. This means in this case, the DUTs should not have frequency dependant responses for small changes in measurement frequency. If M equals 1000, then M+1 is only 0.1% higher. For many applications such a small frequency difference will make no difference in the quality of the measurement. For this example the bandpass filters have zeros at the other frequency, thus, yield perfect rejection.

The general case allows more than two DUTs with each having its own frequency. For example with three DUTs the frequencies could be $$f_A = \frac{M-1}{t_W}, f_B = \frac{M}{t_W}, \text{ and } f_C = \frac{M+1}{t_W}.$$

In addition, there is no requirement that the DUTs be tested at nearly the same frequency. If there are two DUTs that need to be tested each at different frequency then let $$f_A = \frac{J}{t_W} \text{ and } f_B = \frac{K}{t_W},$$

where both J and K are integers chosen to produce frequencies near the desired test frequencies.

Computational operations may be performed, for example, by the controller, by additional controllers within the sources/instrument, or by additional computational resources associated with a still another controller controlling a collection of electrical measurement systems.

The electrical measurement system 10, provides concurrent AC measurements of the connected DUTs without crosstalk degrading the measurements. The measurements may then be, for example, output, stored, displayed or otherwise used.

The system 10 may be used in performing capacitance-voltage measurements using the method of the invention. Measurement of the C-V characteristics of devices involves the measurement of capacitance with respect to voltage. The fact that capacitance is being measured makes it important to minimized crosstalk between DUTs as the crosstalk is often itself a capacitive effect. By using the method of the invention, it is possible to be confident that the measured values are for the DUT of interest, uncorrupted by the measurement of another DUT in proximity to the one of interest.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for making electrical measurements of a first and a second Semiconductor Device Under Test (DUT), said semiconductor DUTs being in sufficient proximity to exhibit crosstalk therebetween, said method comprising:
    applying a first signal to said first semiconductor DUT;
    applying a second signal to said second semiconductor DUT, said first signal and said second signal being contemporaneous and orthogonal to each other, and said first and second signals being at least one of sinusoidal, square wave or triangle wave signals;
    measuring at least one of AC voltage, AC current, AC power, frequency, capacitance and inductance of a first semiconductor DUT response; and
    measuring at least one of AC voltage, AC current, AC power, frequency, capacitance and inductance of a second semiconductor DUT response, wherein said first and second semiconductor DUT responses exhibit independence from said second and first signals, respectively.

2. A method according to claim 1, wherein said first and second signals are sinusoids.

3. A method according to claim 2, wherein said first and second signals have frequencies within 0.1% of each other.

4. A method according to claim 2, wherein said first and second signals do not have frequencies within 0.1% of each other.

5. A method according to claim 1, further comprising applying additional orthogonal signals to respective additional DUTs and measuring respective additional DUT responses, wherein all DUT responses exhibit independence from non-respective signals.

6. A method according to claim 1, wherein said first and second signals are voltage signals and said measured responses are indicative of capacitance.

* * * * *